(12) United States Patent
Masterson

(10) Patent No.: US 8,767,380 B2
(45) Date of Patent: Jul. 1, 2014

(54) SUMP TERMINATION PANEL

(76) Inventor: Franklyn Masterson, Fair Oaks, CA (US)

(*) Notice: Subject to any disclaimer, the term of this patent is extended or adjusted under 35 U.S.C. 154(b) by 332 days.

(21) Appl. No.: 13/385,351

(22) Filed: Feb. 16, 2012

(65) Prior Publication Data

US 2013/0214653 A1   Aug. 22, 2013

(51) Int. Cl.
*H05K 5/00* (2006.01)

(52) U.S. Cl.
USPC ...... 361/678; 361/679.46; 361/692; 361/752; 361/831; 174/520; 174/547; 220/3.2; 312/223.1

(58) Field of Classification Search
USPC ......... 361/601, 610, 616, 627, 633, 644, 661, 361/664, 676–678, 679.46, 688–690, 692, 361/724, 730, 752, 796, 831
See application file for complete search history.

(56) References Cited

U.S. PATENT DOCUMENTS

| | | | |
|---|---|---|---|
| 5,545,844 A * | 8/1996 | Plummer et al. | 174/379 |
| 6,421,229 B1 * | 7/2002 | Campbell et al. | 361/622 |
| 2003/0174487 A1 * | 9/2003 | Garmong | 361/816 |
| 2007/0041789 A1 * | 2/2007 | Monroe et al. | 405/54 |
| 2009/0114413 A1 * | 5/2009 | Daviau | 174/50 |
| 2009/0188916 A1 * | 7/2009 | Daviau | 220/3.2 |

* cited by examiner

*Primary Examiner* — Courtney Smith

(57) ABSTRACT

A cabinet to be interposed between an above ground or underground sump and the control panel for said sump. All electrical connections between the control panel for the operation of the sump or lift station and the sump or lift station itself are disposed within this cabinet. The cabinet has two abutting closed sections, an A section having an open bottom and at least one vented side and a vented door; and a B section having a bottom panel and non-perforated sides and door. A pair of aligned intermediate rear panels close off each section, the only connection between said sections being a cable entry seal disposed in aligned openings in each intermediate rear panel for the passage of cabling from the A section to be mounted for termination in the B section. Any conventional cabling termination means can be employed in the B section.

16 Claims, 5 Drawing Sheets

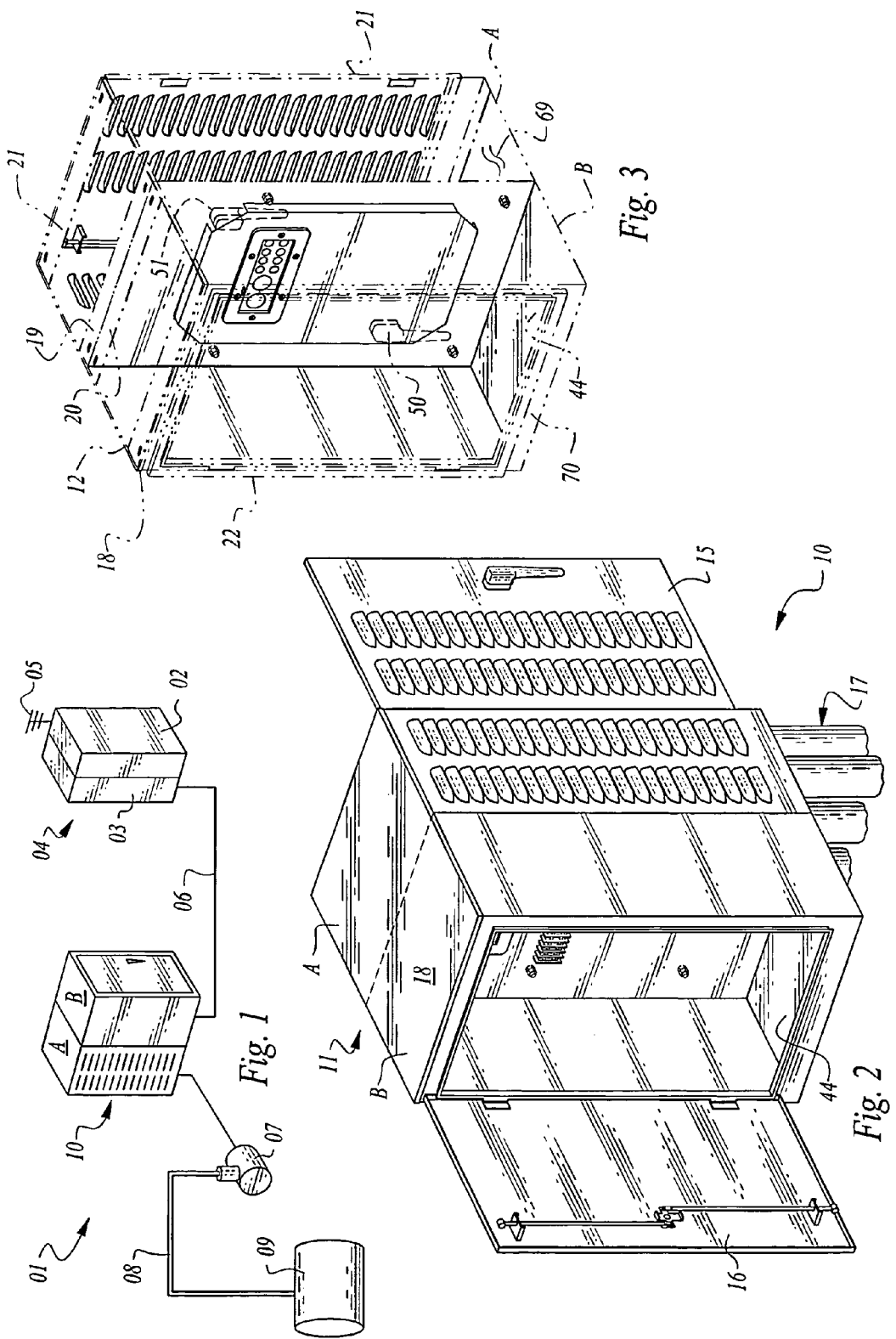

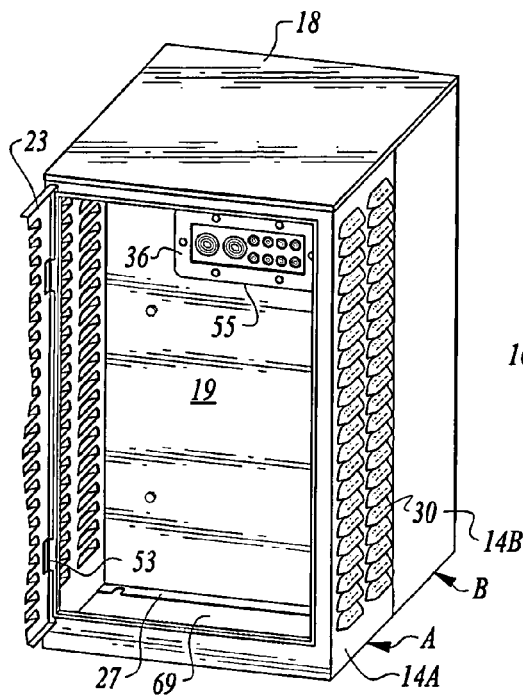 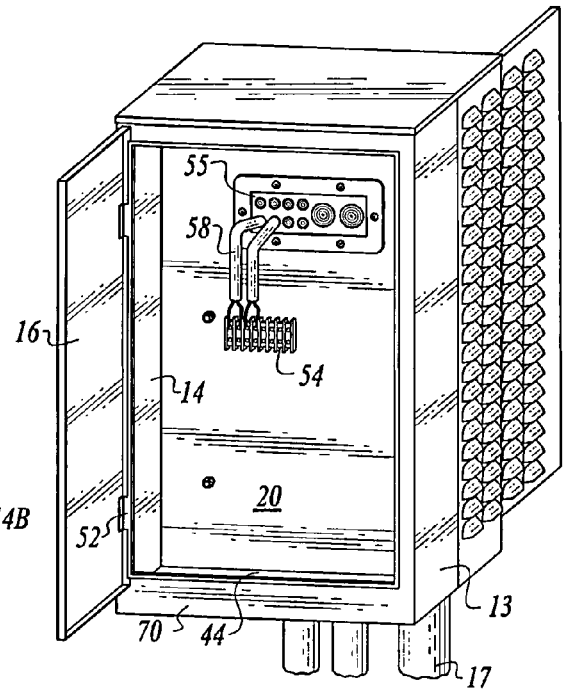
Fig. 8　　　　　Fig. 9
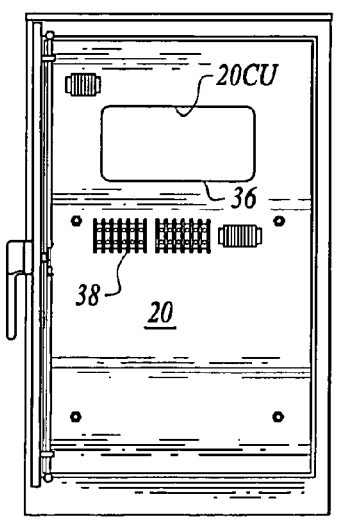 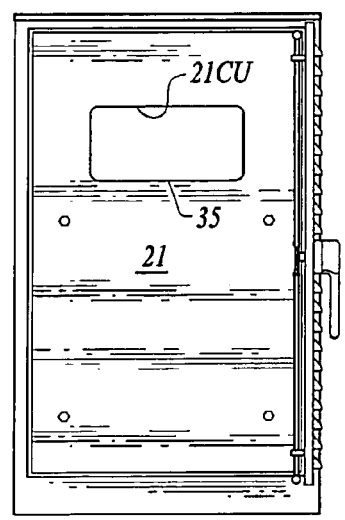
Fig. 10　　　　　Fig. 11

SUMP TERMINATION PANEL

FIELD OF THE INVENTION

This application pertains to an apparatus that is interposed between underground or above ground wiring coming from a sump, and the control panel for the sump.

BACKGROUND OF THE INVENTION

The apparatus of this invention pertains to a cabinet and an interface found therein. This cabinet is to be interposed between an above ground or underground sump and the control panel for the sump or lift station. All electrical connections between the control panel box for the operation of the sump or lift station and the sump or lift station itself are disposed within this cabinet.

Under current regulations, very specific procedures are in place in California and elsewhere, for the splicing of and repair of resin sealed cables used with sumps. The need to splice termination cables is eliminated with the use of the current invention. This is a huge savings in both time and money, as technicians can be utilized for other duties.

It is an object of this invention to provide an apparatus that can be readily serviced to aide in the control of sumps and their pumps.

It is a second object to provide a termination panel that can be easily accessed above ground to make electrical connections to the wiring and cabling entering the sumps.

It is a third object to provide a vandal resistant cabinet that can be maintained close to or distant from a sump control cabinet.

A third object is to provide a two compartment cabinet, with a door for easy access of each compartment.

A fourth object is to provide a NEMA type 3RX cable entry cabinet with physically separate compartments or sections.

It is a fifth object to provide a cabinet that will eliminate the need to splice submersible cables.

It is a sixth object to provide an interface cabinet that permits the venting of hazardous gases, to the atmosphere.

It is a seventh object to provide a cabinet, preferably of stainless steel having two distinct Sections with a barrier in between, through which pump cables can be connected for operation.

It is a eighth object to provide a dual section cabinet having vandal resistant doors.

Other objects of the invention will in part be obvious and will in part appear hereinafter.

The invention accordingly comprises the device possessing the features properties and the relation of components which are exemplified in the following detailed disclosure and the scope of the application of which will be indicated in the appended claims.

For a fuller understanding of the nature and objects of the invention reference should be made to the following detailed description, taken in conjunction with the accompanying drawings.

SUMMARY OF THE INVENTION

"Sump termination panel" is the designation employed in this application for a NEMA type 3RX steel cable entry cabinet suitable for deployment in an industrial environment, and which cabinet has two physically separated Sections; an "A" Section and a "B" Section. These two Sections separate potentially hazardous or corrosive sewage gases from electrical cable termination points and permit ventilation of the gases to the atmosphere. A special type of pass through separation entry is used that does not permit gases that may have come into the A Section from underground to pass into the B Section for delivery to the motor control cabinet(s) and then into the RTU, which is an acronym meaning remote terminal unit. The RTU is not a part of this invention.

By having all joints above ground in the cabinet of this invention, in case there are problems, the need to splice resin sealed submersible cables is eliminated. The breakdown for replacement of cables, and the maintenance of sump systems is rendered significantly easier with the invention of this application installed in line in the sump system.

BRIEF DESCRIPTION OF THE FIGURES

FIG. 1 is a diagrammatic view of this invention in its operating environment.

FIG. 2 is a diagrammatic view of the sump termination panel, hereinafter STP of this invention with its two doors both in the open position.

FIG. 3 is an x-ray view of the apparatus of this invention with the removable roof removed.

FIG. 8 is a front perspective view of the interior of the "A" Section with a portion of the door thereof cut off.

FIG. 9 is related to FIG. 2 and shows a more detailed interior of the "B" Section.

FIG. 10 is an interior view of the "B" Section with the door open, prior to the installation of the cable entry seal.

FIG. 11 is an interior view of the "A" Section with the door open, again, prior to the installation of the cable entry seal.

DESCRIPTION OF THE PREFERRED EMBODIMENT

Figure 4:
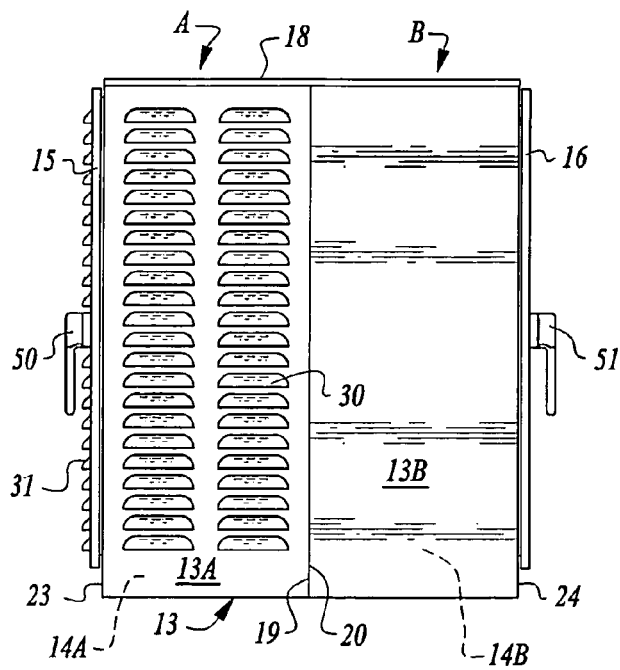
FIG. 4 is a right side elevation thereof.

Let us turn now to FIG. 1. This view is a diagrammatic depiction of a sump system 01 and its controls. System 01 centers around the STP 10 from which conduit 02, containing wiring leads to the motor control station(s) 03 which are in turn connected conventionally to the RTU 04. The sump 09 is connected via underground conduit 08 containing wiring that connects sump pump 07 to the STP 10. Since the sump 07 and the motor controls 03 and the RTU 04 form no part of this invention, no further discussion is deemed necessary.

FIG. 2 is a non-detailed diagrammatic view of the apparatus 10 of this invention. The STP 10 is seen to be a cabinet 11 having a removable roof 18, which overlays the A and B Sections of the cabinet 11. Left Section B has a door 16 hinged on the left side of the cabinet and Section A, has a door 15 that is hinged on the opposite side of its Section. It is within the skill of the art for the two doors also to be hinged on the same side of the cabinet, be it on the left or on the right as may be desired. Section B has a full floor panel 44 connected to the two side panels, only one of which is visible in this FIGURE. Conduits 17 are the same as conduits 06 of FIG. 1, and enter the A Section through an open bottom or an opening in the bottom panel of Section A. More will be said about all of these elements supra.

Note the frame for the cabinet made up of fore and aft spaced top frame members 12 connected at the 4 corners to spaced vertical members 21 of Section A and spaced vertical members 22 for Section B. Upstanding door frame panel 70 disposed beneath the door area of Section B is also seen to be attached to the frame members 22.

FIG. 3 is an X-RAY VIEW OF APPARATUS 10. Note the presence of the two intermediate panels 19 & 20 which serve as the rear panels for Section A and Section B respectively. An opening 69 in the bottom panel of Section A is also seen. The front of the door handle 50 of Section B is seen as well as the rear of the door handle 51 of Section A. The latching mechanism however is not shown in this view. Again, future discussion will be found concerning these components and others that may be seen here, but not discussed.

FIG. 4 depicts a right side elevational view of this apparatus. This nomenclature is picked because the conduit enters the section having the vents, and thus if the STP were to be placed front to back on a land plot, the vented section would be in front. Thus the vented section is designated Section A.

A single roof 18 overlies both Sections. While generally speaking the depth of the two Sections, is generally the same, such is not required. Either Section can be deeper than the other. The right side wall of the cabinet in this FIG. 4 appears to be a single panel which has a series of vertical placed horizontal vents 30 in ½ of the panel that helps to form the A Section, whereas the balance of the panel is smooth and uninterrupted. In reality, the right sidewall 14 is really two panels, 14A, & 14B. The dark line of separation in FIG. 4 between 14A and 14B represents the thickness of the abutted two intermediate rear panels of each of the two sections of the cabinet. See FIG. 3 again. Turning now, though out of order, to FIG. 18, we see a left side perspective view of the total cabinet, wherein panel 13A on the left side of the Figure is the left side of the A Section, and on the right side of the Figure is panel 13B the left side of the B section of he cabinet. Seen disposed between 13A and 13B are the edges of the two intermediate rear panels 19, & 20. Since the two panels are not very thick, relatively, they appear as a solid line.

We return once again to FIG. 4. Front panel or door 15 or the A Section is also seen to have vents 31 therein, while the door 16 of the B Section is smooth, and lacks vents. The rain guard raised area of the front panels is designated 23 in Section A and 24 in Section B. The left side may or may not be a mirror image of FIG. 4. In the preferred embodiment, the full panel is ventless and thus totally smooth. Note that the vented sidewall can be adjacent the hinges of the front door or on the opposite side as the use site may dictate.

Figure 5:
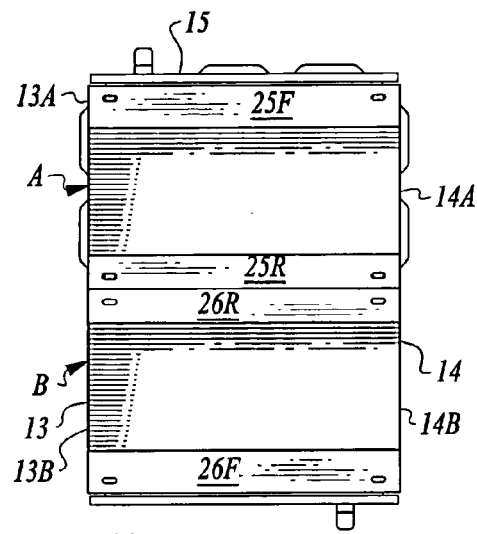
FIG. 5 is a top plan view of this apparatus with the roof removed.

FIG. 5 is a top plan view showing a series of frame members to which the roof panel 18 attaches via its downward extending flanges. These frame members are spaced members 25F and 25R, for front and rear, of Section A and spaced members 26R and 26F of Section B. Note that 25R and 26R abut each other, and thus define two distinct and separate cabinet sections, A and B. Here the vented side panel is adjacent the hinges of the door 15, and that the handle 50 is distant therefrom.

Figure 6:
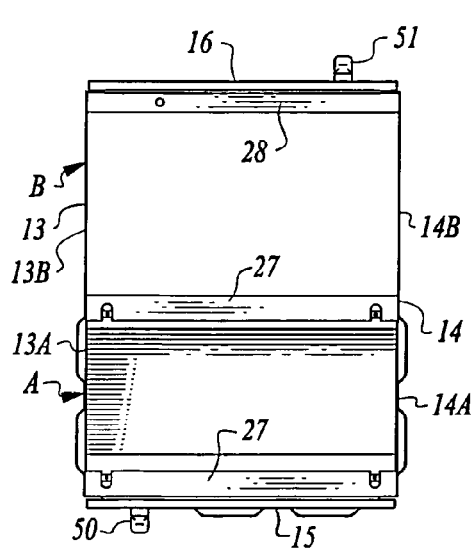
FIG. 6 is a bottom plan view thereof.

FIG. 6 is a bottom plan view of this apparatus. Note that in this view the apparatus has been rotated 180 degrees such that the vented side panel is now on the lower left of the drawing as opposed to the upper left in the drawing of FIG. 5. Note that in the bottom of the apparatus only the vented section has frame members 27. This is due to the fact that with the bottom wall of Section A being entirely open or having a cutout therein, it needs more structural substance than in the top wall area.

Figure 7:
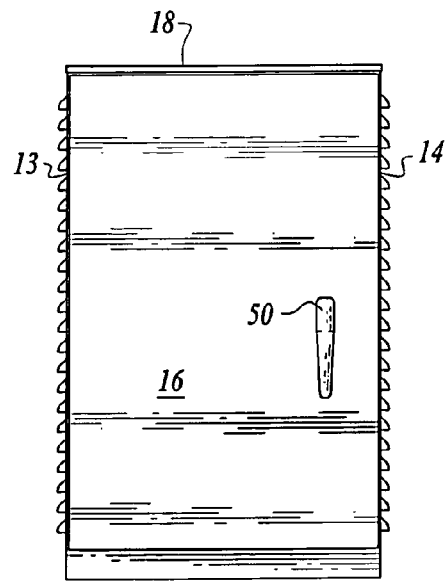
FIG. 7 is a front elevational view of the door panel of the "B" Section thereof.

FIG. 7 is a front elevation of the non-vented section, Section B and it carries designator 16 and handle 50.

FIG. 8 is a front perspective view of the open Section "A" of cabinet 10. As can be seen the right side panel portion 14 is unvented, while left side panel 13 contains a series of horizontally directed vents 30 from top to bottom of the panel forming Section A. Hidden from view are the vertical frame members on the front left and front right, 21 as seen in FIG. 3. Door frame panel 69 is seen to extend the full elevation of Section A, whereas the door 23 has its bottom spaced up from the ground a few inches to allow for ease of opening of the door without dragging on concrete or blacktop. The details of door 23 will be discussed supra. Section A is closed off at the rear by panel 19 which is disposed between the two side panels 13,14 at about the midpoint thereof, per FIG. 2. Bottom panel 27 is seen to have a large opening therein 57 for the entry of conduits, not seen here, but seen elsewhere in other figures. Roof panel, 18 which is the removable top panel overlays both sections of the cabinet 11. The roof 18 is seen to have from, rear and side flanges that depend downwardly as is customary for sheet metal members to be attached at a right angle.

Seen disposed on the rear panel 19 of section A, which panel 19 is disposed just shy of the midpoint between the two upper frame side members 12, is the Roxtec brand cable entry seal, or its functional equivalent. The cable entry seal 55 is disposed within a compression gasket or seal 36.

FIG. 9 shows the other section, Section B of the cabinet 11. It has the two spaced side walls 13B and 14B, a back panel 20, and a non-vented door 16. In this view, the door handle 50 has not as yet been added, nor is the latch seen. Any conventional handle 50 can be used on door panel 52 and any conventional hinge 53 can be utilized on the door panel of Section A. The cable entry seal 55 is seen disposed in an opening in back panel 20. The floor panel 44 is better seen in FIG. 13, as the door frame 70 hides it from this vantage point. Here too, the door is spaced up from the floor, and has conventional inward turning flanges for strength. A buss block 54 is seen mounted on the rear panel 20 and cabling 58 disposed through the seal is connected thereto. The exact circuitry needed to control the sump forms no part of this invention, which is limited to the physical structure of the cabinet, with the cable entry seals and empty buss blocks mounted ready for use. It is within the skill of the purchaser to know how to wire his motor controls to the sump, and if not the buyer should not be buying this apparatus. Seen here also are conduits 17 entering the opening in the floor of the Section A. Note that the cable entry seal is disposed partway in each of the two cabinet sections A & B. Each section has its own compression seal, but there is only 1 cable entry seal employed, disposed within he compression seals for a tight fit.

FIGS. 10 & 11 will be discussed together, as they are the two intermediate rear panels, taken alone before assembly. Panel 20 has a cutout 20CU with a compression seal or gasket 36 disposed around the periphery thereof. Panel 19 has a similar sized aligned cutout 19CU with a compression seal 35 disposed therein. The cable entry seal fits into these two cutouts afore named. Other electrical components may be mounted on panel 20 for the benefit of the purchaser to simplify the buyer's wiring chore. But panel 21 remains bare to avoid possible contact with hydrogen sulfide and other noxious gases that could be present.

Figure 12:
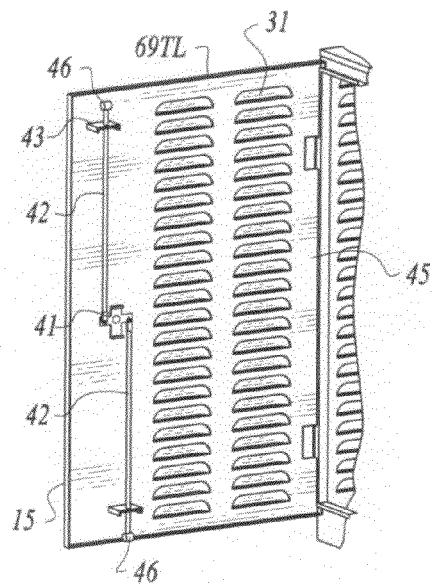
FIG. 12 is a partial interior view of the front door of the "A" Section and the vandal resistant lock mechanism thereof.

FIG. 12 depicts a cutaway segment of front panel 15, IE the door of the Section A. Here the latching mechanism is seen that inhibits vandalism. A cross shaped member 41 is bolted to the door handle and is permitted to rotate therewith. Movement of the handle causes the rods 42 attached to cross 41 to move below the top lip of the door frame 70TL for Section B of the cabinet and 69 TL for the Section A., and above the bottom lip of each of the respective doors, thereby permitting the door to be opened. See FIGS. 8 & 13. These rods are retained in a vertical disposition by rod holders 43. A rubber tip unnumbered may be disposed on the tip of each of the 4 rods used for the 2 similar doors. When the handle is moved upwardly to a horizontal disposition, the rods are extended as the cross rotates to its true 12,3,6,9 o'clock disposition for its arms from the offset disposition of the arms when open as seen in this view. Both door latches operate in the same manner. For that reason, the latch area of door panel 24 of Section B is not seen in FIG. 13.

Figure 13:
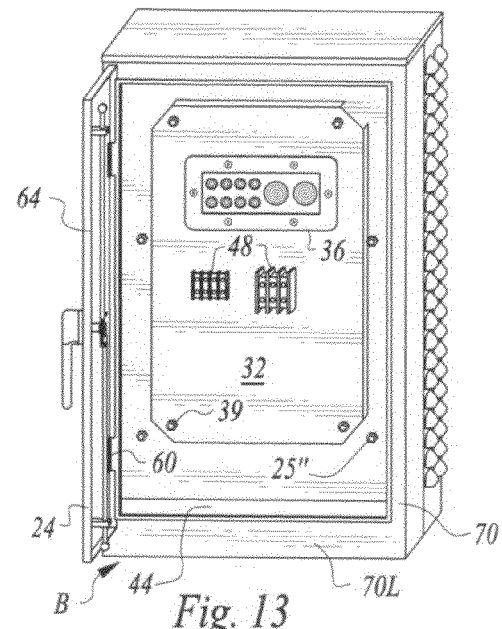
FIG. 13 is an interior view of the "B" Section with a variant separation panel installed, with a cable entry seal and other components mounted on the alternate panel and also showing only a portion of the "B" Section door.

FIG. 13 can now be discussed, though aspects of it have been referred to previously. In this FIGURE, the interior of the B Section is seen, with a cutoff portion of the door of the B Section. This section is seen to have a flat panel bottom 44, and a door frame 70 normal to the bottom panel. The bottom lip or upstanding portion of the door frame is designated 70L. In this FIGURE a variant construction is used in that the intermediate rear B section panel is framework 25' to which a detachable panel 32 is screwed or bolted on by bolt/nut combination 39 seen in each of the 4 corners of the panel 32. Disposed in the center of panel 32 is a compression seal 36 which retains a portion of the cable entry seal for enclosures, 48. Disposed beneath element 48 are various electrical connection blocks, which are chosen by the customer to suit its needs such that specificity is irrelevant. The unnumbered second bolt set each of which is disposed on the frame 25" are used to join the two intermediate rear panels together.

A pair of conventional door hinges 60 are spaced from each other vertically and are mounted on the door frame 70 and on the door edge 24 of the B section. The door 24 is seen to be unvented.

Figure 14:
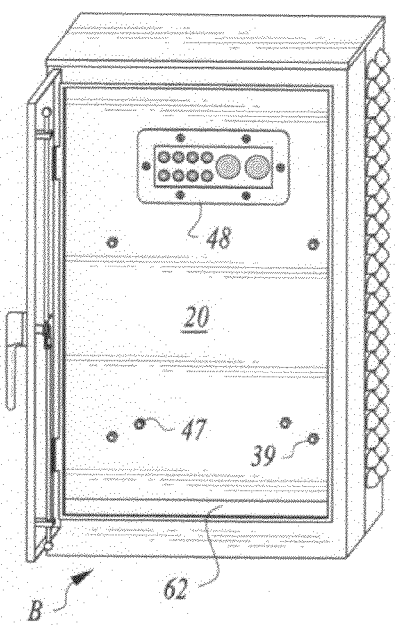
FIG. 14 is a view similar to FIG. 13 but showing the standard rear wall cabinet construction for Section B, again with the cable entry seal in place.

In contrast we turn to FIG. 14, wherein the conventional construction of the rear panel of Section B is seen in a similar view. Here a solid sheet panel 20 serves as the intermediate rear panel. Here, again two distinct sets of bolts are seen. The inner bolts designated 47 and the outer un-numbered bolts. Both sets of bolts and nuts secure the two intermediate rear panels to each other. Again, the cable entry seal for enclosures, 48, is seen at the same location, disposed horizontally on the back panel. The compression retaining seal is unseen in this view.

Figure 15:
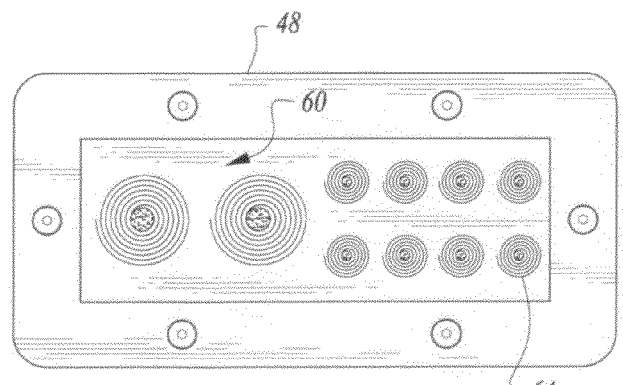
FIG. 15 is a closeup view of the prior art cable entry seal utilized with this invention.

In FIG. 15, a closeup front view of the cable entry seal for enclosures is seen, and designated 48. The seal includes a perforated plate 60 having a series of flexible coils, each tightly mounted in an aperture. A central opening is present through which a cable may be disposed. As seen in this FIGURE two distinct sizes of coils are shown. Other combinations of coil diameters are available. The unit depicted is a Roxtec® CF-16/10 which means the device will hold 10 cables. Reference is made to the Hedstrom U.S. Pat. No. 7,371,969 assigned to Roxtec, a corporation located in Sweden, among others relating to this technology. One uncoils as much of the rope needed to enlarge the opening as may be needed. The two larger cable holders will accept cables having a diameter that varies from 0.374 inches to 1.280 inches, while eight littler ones accept cables of a diameter in the range of 0.138 inches to 0.650 inches Other cable entry seals for enclosures of different configurations made by Roxtec® as well as similar seals made by other electrical component manufacturers may be utilized. Other sources of cable entry seals include he website www.te.com among others. While the cable entry seals are a component of this invention, each user may have the opportunity to specify the configuration desired for its specific situation, and no specific one is specified herein.

Figure 16:
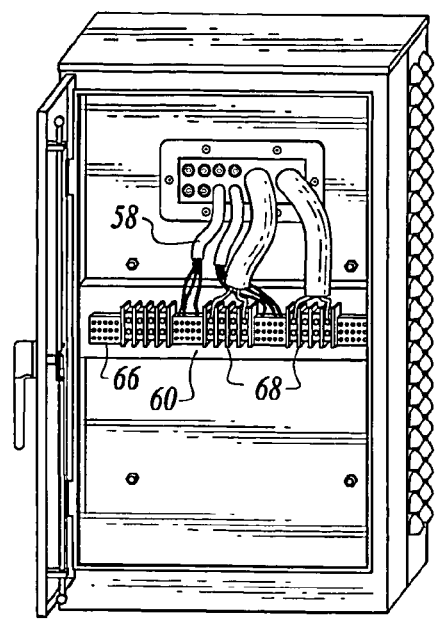
FIG. 16 is a view similar to FIG. 15 but at a point in time later showing electrical components having been wired together.

FIG. 16 is a view related to FIG. 14. While having a Roxtec® seal therein, terminal end blocks 68 are seen mounted on a buss mount 60. Both of these components 60 and 68 are seen to be conventional in the electrical components industry. Cables 58, again non-specific, are seen exiting the cable entry seal and are attached to components on 68, in a purely illustrative manner. An optional handle on the floor panel to raise it up for removal should such be needed is also seen. Note again that in this view the standard or regular B section full panel rear intermediate wall is shown.

Figure 17:
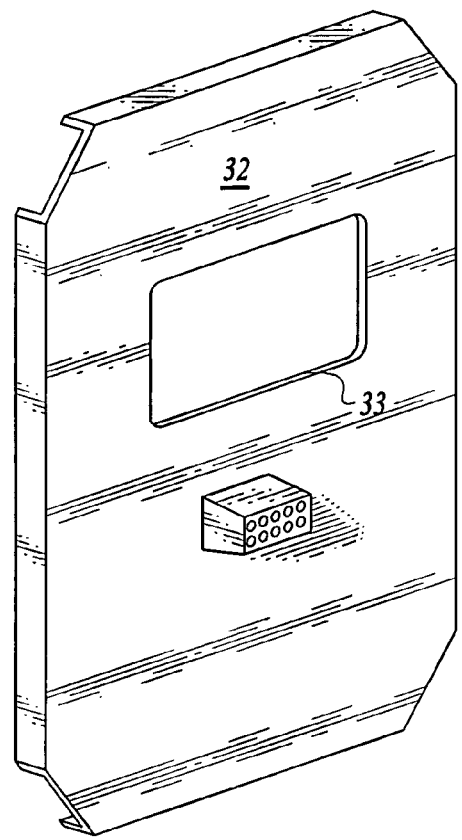
FIG. 17 is a view showing a technician holding one of the variant separation panels for the "B" Section, and also showing the door handle mounted on a "B" Section door.

FIG. 17 is an elevational view of he variant Section B intermediate rear panel 32. The compression seal 35 that would be disposed in the opening for the cable entry sea 33, is not seen in this view. Disposed adjacent the worker holding the variant rear intermediate panel is the front door, 16 of Section B. Disposed thereon is a door handle 50, which moves in a downward direction, as shown by directional arrow 99, to actuate the latch mechanism discussed in detail infra. A similar handle acting in like manner is employed n the A section.

Figure 18:
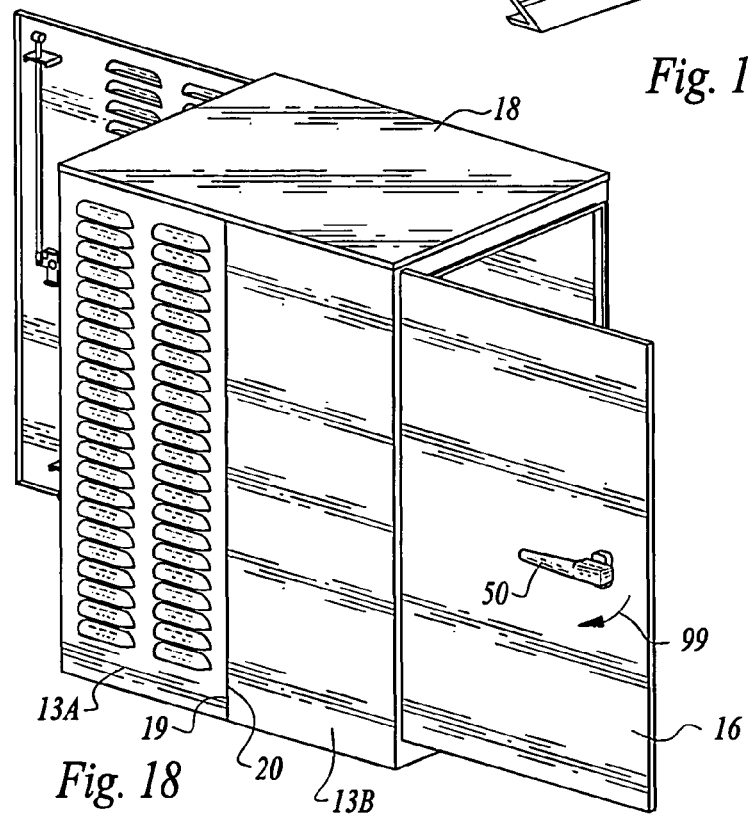
FIG. 18 is a left side perspective view of the cabinet of this invention with both doors open.

FIG. 18 has been discussed infra.

It is seen that I have created a cabinet known in the trade as a sump termination panel, since that is the function of the cabinet. The panel refers to the combination of the two abutting intermediate rear panels, with the cable entry seal for enclosures disposed between them in a sealingly fashion. That way any noxious gas that enters through the open bottom of Section A can NOT penetrate into Section B as the only common area is the tightly disposed individual seals within the cable entry seal unit. Changes, splices, & maintenance, all as needed can take place safely above ground away from fumes, merely by accessing the Section B of the cabinet of this invention.

The Section A of the cabinet shown in the FIGURES has a vented door and one vented side panel. It is within the scope of the invention for said Section A to have two vented sides, plus or minus a vented door. Since the construction of such other embodiments is readily understood, no additional FIGURES are presented to illustrate these constructions.

It is also to be noted that while in the embodiment shown, only one cable entry seal is present disposed within the two abutting intermediate rear panels, any number of such seals may be employed in the intermediate rear panels to suit the needs of the user.

Suitable materials for the cabinet of this invention include stainless steel, anodized aluminum, and noxious gas resistant polymeric sheets.

Since certain changes may be made in the above described apparatus without departing from the scope of the invention herein involved, it is intended that all matter contained in the above description and in the accompanying drawings, if present, shall be interpreted as illustrative only and not in a limiting sense.

I claim:

1. A cabinet to be interposed between an above ground or underground sump and the control panel for said sump which comprises two sections, an "A" section and a "B" Section,
    said "A" section having two spaced parallel sides, an open bottom and a hinged openable door and including an intermediate rear panel;
    said "B" section having two spaced parallel sides, a closed bottom and a hinged openable door, and including an intermediate rear panel;
    said cabinet's two intermediate rear panels being equally dimensioned, and connected to each other, and each having at least one opening aligned with a similar opening in the other intermediate rear panel, with a cable entry seal disposed in each pair of aligned openings,
    wherein at least one of, said door and said two side panels, of the Section A is vented.

2. The cabinet of claim 1 wherein one roof panel overlays and closes off both sections of said cabinet.

3. The cabinet of claim 1 wherein the door and at least one side of the Section A is vented.

4. The cabinet of claim 3 wherein the door and one side panel of Section A are vented with a series of vents from top to bottom.

5. The cabinet of claim 1 wherein the door of Section B is non-vented, and the cabinet's two doors are hinged in opposite directions.

6. The cabinet of claim 5 wherein the intermediate rear panel of Section B comprises a frame to which is bolted a removable panel.

7. The cabinet of claim 2 wherein the one cable entry seal is disposed within a compression seal in each of the aligned openings of the two intermediate rear panels.

8. The cabinet of claim 1 wherein each door includes a handle and a vandal resistant locking mechanism, and the cabinet is made of stainless steel, and at least one cable entry seal.

9. A cabinet to be interposed between an above ground or underground sump and the control panel for said sump which comprises two sections, an "A" section and a "B" Section,
    said "A" section having two spaced parallel sides, an open bottom and a hinged openable door and including an intermediate rear panel;
    said "B" section having two spaced parallel sides, a closed bottom and a hinged openable door, and including an intermediate rear panel;
    said cabinet's two intermediate rear panels being equally dimensioned, and connected to each other, and each having at least one opening aligned with a similar opening in the other intermediate rear panel, with a cable entry seal disposed in each pair of aligned openings,
    wherein, said door and one side panel, of the Section A are vented.

10. The cabinet of claim 9, wherein the door of Section B is non-vented, and the two doors are hinged in opposite directions, and each door has a handle which operates a vandal resistant locking mechanism.

11. The cabinet of claim 10 wherein the door of the Section A and the door of the Section B are each mounted in a door frame, and the bottom of respective door is spaced up from the ground.

12. The cabinet of claim 11 wherein the cabinet is constructed of stainless steel and the one cable entry seal is disposed in a pair of compression seals, one per intermediate rear panel.

13. The cabinet of claim 12 where the cable entry seal is made in accordance with the technology disclosed and claimed in U.S. Pat. No. 7,371,969.

14. A cabinet to be interposed between an above ground or underground sump and the control panel for said sump which comprises two sections, an "A" section and a "B" Section,
    said "A" section having two spaced parallel sides, an open bottom and a hinged openable door with a handle thereon and including an intermediate rear panel;
    said "B" section having two spaced parallel sides, a closed bottom and a hinged openable door with a handle thereon, and including an intermediate rear panel;
    said cabinet's two intermediate rear panels being equally dimensioned, and connected to each other, and each having at least one opening aligned with at least one similar opening in the other intermediate rear panel, with a cable entry seal disposed in each pair of aligned openings,
    wherein at least one of, said door and said two side panels, of the Section A is vented, and wherein one roof panel overlays and closes off both sections of said cabinet.

15. The cabinet of claim 14, further including a key lock in each door handle and vandal resistant dual rod locking mechanism to ward off vandals disposed on the inside of each door and connected to its handle.

16. The cabinet of claim 1, further including a key lock in each door handle and vandal resistant dual rod locking mechanism to ward off vandals disposed on the inside of each door and connected to its handle.

* * * * *